(12) United States Patent
Wang et al.

(10) Patent No.: US 10,884,051 B2
(45) Date of Patent: Jan. 5, 2021

(54) LINE DETECTING TOOL AND LINE DETECTING METHOD FOR LIGHT EMITTING DIODE SUBSTRATE

(71) Applicants: Beijing BOE Optoelectronics Technology Co., Ltd., Beijing (CN); BOE Technology Group Co., Ltd., Beijing (CN)

(72) Inventors: Zhiqiang Wang, Beijing (CN); Xuerong Wang, Beijing (CN); Xin Ma, Beijing (CN); Chuan Sun, Beijing (CN); Lei Chen, Beijing (CN); Fei Gao, Beijing (CN); Bochao Rui, Beijing (CN); JinLong Zheng, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 115 days.

(21) Appl. No.: 16/382,975

(22) Filed: Apr. 12, 2019

(65) Prior Publication Data

US 2020/0096552 A1   Mar. 26, 2020

(30) Foreign Application Priority Data

Sep. 26, 2018   (CN) .......................... 2018 1 1122244

(51) Int. Cl.
  *G01R 31/26*   (2020.01)
  *G01R 31/50*   (2020.01)
  (Continued)

(52) U.S. Cl.
  CPC ......... *G01R 31/2635* (2013.01); *G01R 31/50* (2020.01); *G02F 1/1306* (2013.01);
  (Continued)

(58) Field of Classification Search
  CPC .. G01R 31/2635; G01R 31/50; G01R 31/316; G01R 31/2851; G02F 1/1306;
  (Continued)

(56) References Cited

U.S. PATENT DOCUMENTS 5,081,687 A * 1/1992 Henley ................ G01R 31/316
                                                    345/87
5,432,461 A * 7/1995 Henley ................ G01R 31/311
                                                    324/760.02

(Continued)

FOREIGN PATENT DOCUMENTS

JP          04239664 A  *  8/1992

*Primary Examiner* — Christopher E Mahoney
(74) *Attorney, Agent, or Firm* — Westman, Champlin & Koehler, P.A.

(57) ABSTRACT

Embodiments of the present disclosure provide a line detecting tool and method for a light emitting diode substrate. The line detecting tool for a light emitting diode substrate includes a detecting light source and a liquid crystal plate. The liquid crystal plate is configured to be arranged between the detecting light source and a light emitting diode substrate to be detected and to be in contact with each set of positive electrode and negative electrode of the light emitting diode substrate, so as to transform from a light transmission state to a light shielding state or from the light shielding state to the light transmission state after energizing the each set of positive electrode and negative electrode of the light emitting diode substrate to be detected. The detecting light source is configured to illuminate the liquid crystal plate.

12 Claims, 4 Drawing Sheets

(51) Int. Cl.
  *G09G 3/00* (2006.01)
  *G02F 1/13* (2006.01)
  *H01L 21/66* (2006.01)
  *G01R 31/54* (2020.01)
(52) U.S. Cl.
  CPC ............. *G09G 3/006* (2013.01); *H01L 22/14*
        (2013.01); *G01R 31/54* (2020.01)
(58) Field of Classification Search
  CPC ........ G02F 1/1313; G05B 2219/14048; G05B
            2219/14049; G01M 11/00; G01M 11/081;
              G01M 11/0285; G01M 11/0278; H01L
                  22/24; H01L 22/14; G09G 3/006
  See application file for complete search history.

(56) References Cited

U.S. PATENT DOCUMENTS

| | | | | |
|---|---|---|---|---|
| 8,581,269 B2 * | 11/2013 | Kuk | .......................... | B41J 2/45 |
| | | | | 257/88 |
| 2006/0280356 A1 * | 12/2006 | Yamagishi | ............... | G09G 3/36 |
| | | | | 382/141 |
| 2012/0194628 A1 * | 8/2012 | Okazaki | ........... | G03G 15/04054 |
| | | | | 347/224 |
| 2012/0249776 A1 * | 10/2012 | Ji | ....................... | G01R 31/2635 |
| | | | | 348/125 |
| 2017/0309799 A1 * | 10/2017 | Cummings | ........... | H01L 33/502 |

* cited by examiner

LINE DETECTING TOOL AND LINE DETECTING METHOD FOR LIGHT EMITTING DIODE SUBSTRATE

CROSS-REFERENCE TO RELATED APPLICATION

This application claims the benefit of Chinese Patent Application No. 201811122244.1, entitled "LINE DETECTING TOOL AND LINE DETECTING METHOD FOR LIGHT EMITTING DIODE SUBSTRATE", filed with the State Intellectual Property Office of China on Sep. 26, 2018, the whole disclosure of which is incorporated herein by reference.

TECHNICAL FIELD

Embodiments of the disclosure relate to display technology field, and particularly to a line detecting tool and method for a light emitting diode substrate.

DESCRIPTION OF RELATED ART

Mini/micro light emitting diode display, as an integral technology combining display technology with lighting technology of a light emitting diode, has many advantages such as self-illumination, high efficiency, low power consumption, high integration and high stability, and thus has broad market prospects.

Currently, a circuit line of a light emitting diode substrate, before light emitting diodes are formed on the light emitting diode substrate, is detected by a probe for electric conduction. However, with the development of the scale of the light emitting diode substrate, that is, as the number of LED chips increases, if the line of the light emitting diode substrate is detected by means of the probe, the line connected to each light emitting diode has to be detected one by one, which leads the detection of the LED connection line to be in low efficiency and has been difficult to meet the line detection requirements of the light emitting diode substrate.

SUMMARY

Embodiments of the present disclosure provide a line detecting tool and a line detecting method for a light emitting diode substrate, which increase detection efficiency and universality of the line detecting tool for the light emitting diode substrate.

As an aspect, there is provided a line detecting tool for a light emitting diode substrate comprising a detecting light source and a liquid crystal plate, wherein, the liquid crystal plate is configured to be arranged between the detecting light source and a light emitting diode substrate to be detected and to be in contact with each set of positive electrode and negative electrode of the light emitting diode substrate, so as to transform from a light transmission state to a light shielding state or from the light shielding state to the light transmission state after energizing the each set of positive electrode and negative electrode of the light emitting diode substrate to be detected;

the detecting light source is configured to illuminate the liquid crystal plate.

In an embodiment, the liquid crystal plate comprises a first substrate and a second substrate, configured to be opposite to each other, and a liquid crystal between the first substrate and the second substrate; and the liquid crystal plate farther comprises an alignment film on a surface of the first substrate facing the liquid crystal and/or on a surface of the second substrate facing the liquid crystal;

a surface, away from the liquid crystal, of either, which is provided with the alignment film, of the first substrate and the second substrate is configured to contact the each set of positive electrode and negative electrode of the light emitting diode substrate to be detected.

In an embodiment, a thickness of one, which is configured to contact the each set of positive electrode and negative electrode of the light emitting diode substrate to be detected, of the first substrate and the second substrate of the liquid crystal plate is less than or equal to 0.1 mm.

In an embodiment, at least one spacer is provided between the first substrate and the second substrate to support the first substrate and the second substrate.

In an embodiment, the liquid crystal comprises a color liquid crystal.

In an embodiment, the first substrate and the second substrate each comprise a transparent glass substrate or a transparent resin substrate.

As an aspect, there is provided a line detecting method for a light emitting diode substrate, the line detecting method comprising:

covering a liquid crystal plate on a surface of a light emitting diode substrate to be detected and contacting the liquid crystal plate with each set of positive electrode and negative electrode of the light emitting diode substrate to be detected;

illuminating the liquid crystal plate by a detecting light source at a side of the liquid crystal plate away from the light emitting diode substrate to be detected; and energizing the each set of positive electrode and negative electrode of the light emitting diode substrate to be detected and detecting an electric conduction of the each set of positive electrode and negative electrode of the light emitting diode substrate to be detected depending on a light transmission state of the liquid crystal plate.

In an embodiment, the liquid crystal plate is of light transmission in a turn-on state; the detecting an electric conduction of the each set of positive electrode and negative electrode of the light emitting diode substrate to be detected depending on a light transmission state of the liquid crystal plate comprises: detecting the light transmission state of the liquid crystal plate; if a portion of the liquid crystal plate corresponding to a set of positive electrode and negative electrode is of light transmission, the set of positive electrode and negative electrode corresponding to the portion that is of light transmission is in electric conduction; if a portion of the liquid crystal plate corresponding to a set of positive electrode and negative electrode is not of light transmission, the set of positive electrode and negative electrode corresponding to the portion that is not of light transmission is not in electric conduction; or the liquid crystal plate is of light transmission in a turn-off state; the detecting an electric conduction of the each set of positive electrode and negative electrode of the light emitting diode substrate to be detected depending on a light transmission state of the liquid crystal plate comprises: detecting the light transmission state of the liquid crystal plate; if a portion of the liquid crystal plate corresponding to a set of positive electrode and negative electrode is of light transmission, the set of positive electrode and negative electrode corresponding to the portion that is of light transmission is not in electric conduction; if a portion of the liquid crystal plate corresponding to a set of positive electrode and negative electrode is not of light transmission, the set of positive electrode and negative electrode corresponding to the portion that is not of light transmission is in electric conduction.

In an embodiment, the liquid crystal plate comprises a first substrate and a second substrate, configured to be opposite to each other, and a liquid crystal between the first substrate and the second substrate; and the liquid crystal plate further comprises an alignment film on a surface of the first substrate facing the liquid crystal and/or a surface of the second substrate facing the liquid crystal;

the contacting the liquid crystal plate with each set of positive electrode and negative electrode of the light emitting diode substrate to be detected comprises: contacting a surface, away from the liquid crystal, of either one, which is provided with the alignment film, of the first substrate and the second substrate with the each set of positive electrode and negative electrode of the light emitting diode substrate to be detected.

In an embodiment, the liquid crystal plate comprises a first substrate and a second substrate, configured to be opposite to each other, and a liquid crystal between the first substrate and the second substrate; and the liquid crystal plate further comprises an alignment film on a surface of the first substrate facing the liquid crystal and/or a surface of the second substrate facing the liquid crystal;

the contacting the liquid crystal plate with each set of positive electrode and negative electrode of the light emitting diode substrate to be detected comprises: contacting a surface, away from the liquid crystal, of either one, which is provided with the alignment film, of the first substrate and the second substrate with the each set of positive electrode and negative electrode of the light emitting diode substrate to be detected.

In an embodiment, at least one spacer is provided between the first substrate and the second substrate;

when the liquid crystal plate covers the surface of the light emitting diode substrate to be detected, an orthographic projection of the at least one spacer of the liquid crystal plate on the light emitting diode substrate to be detected never overlaps any one of the sets of positive electrodes and negative electrodes of the light emitting diode substrate to be detected.

In an embodiment, at least one spacer is provided between the first substrate and the second substrate;

when the liquid crystal plate covers the surface of the light emitting diode substrate to be detected, an orthographic projection of the at least one spacer of the liquid crystal plate on the light emitting diode substrate to be detected never overlaps any one of the sets of positive electrodes and negative electrodes of the light emitting diode substrate to be detected.

BRIEF DESCRIPTION OF THE DRAWINGS

The drawings illustrated herein are provided to further understand the present disclosure and constitute a portion of the present disclosure. The exemplary embodiments in the present disclosure and their description are used for interpret the present disclosure, but do not limit the present disclosure. In the drawings.

DETAILED DESCRIPTION

In order to further describe a line detecting tool and method for a light emitting diode substrate according to embodiments of the present disclosure, description in detail will be made with reference to the drawings.

Figure 1:
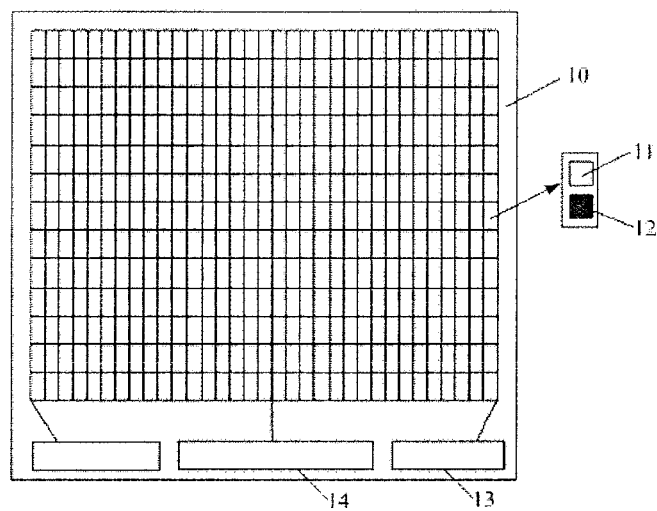
FIG. 1 is a structural schematic view of a light emitting diode substrate to be detected provided by embodiments of the present disclosure.
Figure 2:
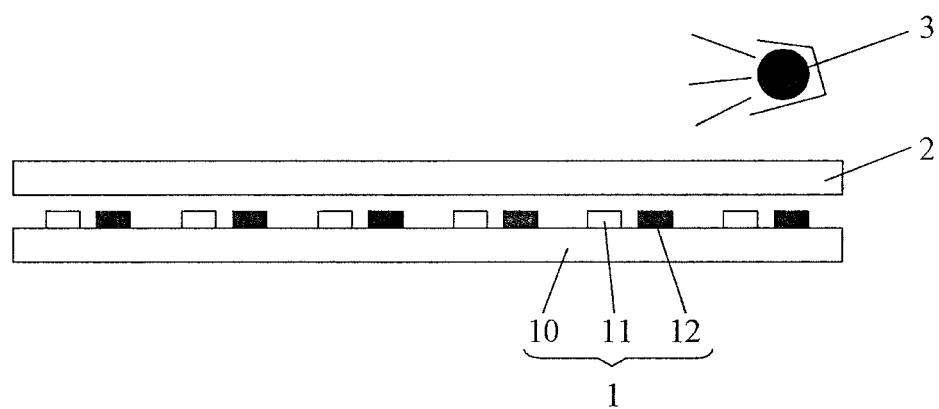
FIG. 2 is a structural schematic view of a line detecting tool provided by embodiments of the present disclosure.

FIG. 1 is a structural schematic view of a light emitting diode substrate 1 to be detected and FIG. 2 is a structural schematic view of a line detecting tool for a light emitting diode substrate according to embodiments of the present disclosure. The line detecting tool includes a detecting light source 3 and a liquid crystal plate 2. In the embodiment, the liquid crystal plate 2 is arranged between the detecting light source 3 and the light emitting diode substrate 1 to be detected and is in contact with each set of positive electrodes and negative electrodes of the light emitting diode substrate 1 to be detected; the detecting light source 3 is configured to illuminate the liquid crystal plate 2. In the embodiment, the liquid crystal plate 2 may be a common liquid crystal plate and may be transformed from a light transmission state to a light shielding state or from a light shielding state to a light transmission state due to electrical voltage of the positive and negative electrodes after energizing each set of positive electrode and negative electrode of the light emitting diode substrate 1 to be detected, such that electric connection of each set of positive electrode and negative electrode of the light emitting diode substrate 1 may be detected according to the light transmission state of a respective portion, corresponding to the set of positive electrode and negative electrode, of the liquid crystal plate 2.

According to the embodiments of the present disclosure, a detecting light source and a liquid crystal plate are combined to obtain a line detecting tool for a light emitting diode substrate such that, by contacting the liquid crystal plate with each set of positive electrode and negative electrode of the light emitting diode substrate, illuminating the liquid crystal plate by the detecting light source and energizing the positive and negative electrodes, an electrical connection with relation to the each set of positive electrode and negative electrode, which are in contact with the liquid crystal plate, of the light emitting diode substrate to be detected may be accurately detected according to the light transmission state of the liquid crystal plate. The line detecting tool according to the embodiments of the present disclosure may be produced in low cost and may achieve a convenient line detection on a light emitting diode substrate without being limited by a spacing size between a positive electrode and a negative electrode of two adjacent sets of positive and negative electrodes in a light emitting diode substrate to be detected, that is, a line detection on a light emitting diode substrate may be performed by covering the liquid crystal plate on a light emitting diode substrate to be detected no matter what a spacing size between a positive electrode and a negative electrode of two adjacent sets of positive and negative electrodes in a light emitting diode substrate to be detected is. Therefore, the line detecting tool has high universality. Compared with detection of each set of positive electrode and negative electrode in a light emitting diode substrate one by one with a probe in related art, the line detecting tool according to the embodiments of the present disclosure may simultaneously detect electrical conduction of entire sets of positive and negative electrodes in a light emitting diode substrate upon covering the liquid crystal plate on a light emitting diode substrate to be detected directly such that the liquid crystal plate are in contact with each set of positive electrode and negative electrode in the light emitting diode substrate to be detected, and thus largely increases detection efficiency and is in favor of detection of circuit lines of light emitting diode substrates in batches.

A light emitting diode substrate 1 to be detected as shown in FIG. 1 generally includes a base substrate 10 and a plurality of sets of positive electrodes and negative electrodes arranged in array on the base substrate 10. The sets of positive electrodes and negative electrodes are commonly made of a metal conductive material, such as copper. In an embodiment, each set of positive electrode and negative electrode include one positive electrode 11 and one negative electrode 12, and one set of positive electrode and negative electrode is provided to connect one light emitting diode. The base substrate 10 may be further provided with a positive electrode bonding area 13 that is in connection with the positive electrodes of the sets of positive and negative electrodes and a negative electrode bonding area 14 that is in connection with the negative electrodes of the sets of positive and negative electrodes. It is noted that the detection on the line of the light emitting diode substrate 1 to be detected according to the embodiments of the present disclosure specifically means detection on the light emitting diode substrate 1 to be detected before a light emitting diode is formed on the light emitting diode substrate 1 so as to determine whether the positive electrode and the negative electrode of each set of positive electrode and negative electrode of the light emitting diode substrate 1 to be detected are electrically conducted or not. FIG. 1 shows a positive bonding area 13 and a negative bonding area 14, which are respectively configured to input signal to the positive electrodes and the negative electrodes. The positive bonding area 13 and the negative bonding area 14 may be designed in any way as long as they may allow the positive electrodes and the negative electrodes of the light emitting diode substrate 1 to obtain electric signal.

The above mentioned detecting light source 3 may be at a side of the liquid crystal plate 2 away from the light emitting diode substrate 1 to be detected and specifically may be placed in several ways. For example, in an embodiment, the detecting light source 3 is arranged near edge at a side of the liquid crystal plate 2 away from the light emitting diode substrate 1 to be detected such that the detecting light source 3 illuminates the liquid crystal plate 2 obliquely. In an embodiment, the detecting light source 3 is arranged near central region at a side of the liquid crystal plate 2 away from the light emitting diode substrate 1 to be detected such that the detecting light source 3 may illuminate the liquid crystal plate 2 perpendicularly. In addition, the detecting light source 3, as a provider of a light signal, may be any type of lighting element or luminaire. In an embodiment, the detecting light source 3 may be light emitting diode lamp bar or light emitting diode strip light.

In an embodiment, the positive electrodes and the negative electrodes of the sets of positive electrodes and negative electrodes are exposed on a surface of the light emitting diode substrate 1 to be detected such that the liquid crystal plate 2 may be in contact with each set of positive electrode and negative electrode of the light emitting diode substrate 1 to be detected upon covering the liquid crystal plate 2 on the surface of the light emitting diode substrate 1 to be detected. Then, the detecting light source 3 at a side of the liquid crystal plate 2 away from the light emitting diode substrate 1 to be detected is lighted and each set of positive electrode and negative electrode of the light emitting diode substrate 1 to be detected are energized such that an electric field is formed between a positive electrode and a negative electrode adjacent to the positive electrode, of the light emitting diode substrate 1 so as to allow the liquid crystal plate 2 to transform from a light transmission state to a light shielding state or from the light shielding state to the light transmission state in an in-plane switching mode under action of the electric field formed.

It is understood that the liquid crystal plate 2 may be a structure that is of light transmission in a turn-on state, that is, the liquid crystal plate 2 is transformed from a light shielding state to a light transmission state under action of an electric field. In another embodiment, the liquid crystal plate 2 may be a structure that is of light transmission in a turn-off state, that is, the liquid crystal plate 2 is transformed from a light transmission state to a light shielding state under action of an electric field.

Exemplarily, in an embodiment, the liquid crystal plate 2 is in a structure that is of light transmission in a turn-on state.

Figure 4:
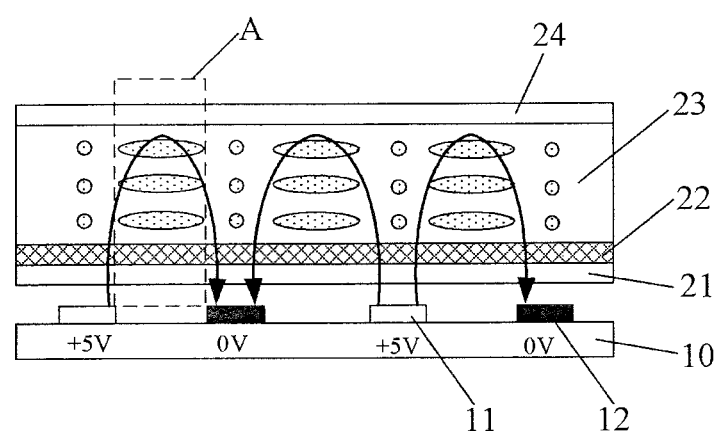
FIG. 4 is a schematic state view of a liquid crystal plate, in a state where the corresponding positive and negative electrodes are in electric conduction, provided by embodiments of the present disclosure.
Figure 5:
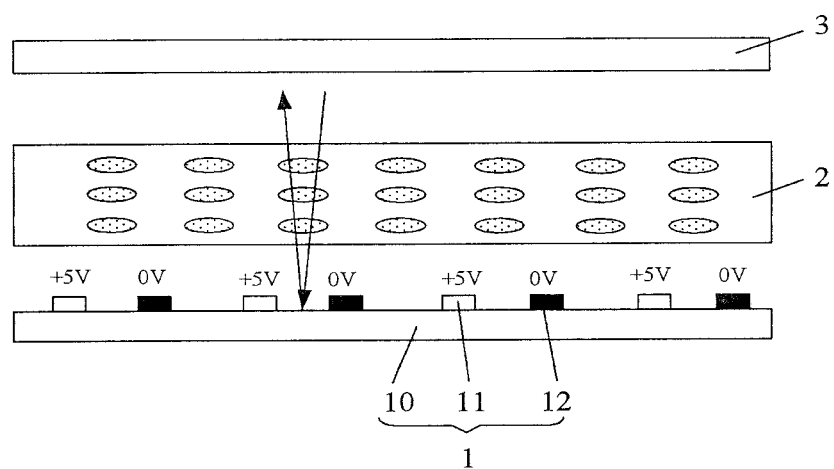
FIG. 5 is a schematic view for detection of the line detecting tool, as shown in FIG. 2, on the light emitting diode substrate in case where each set of positive electrode and negative electrode thereof is in electric conduction.
Figure 6:
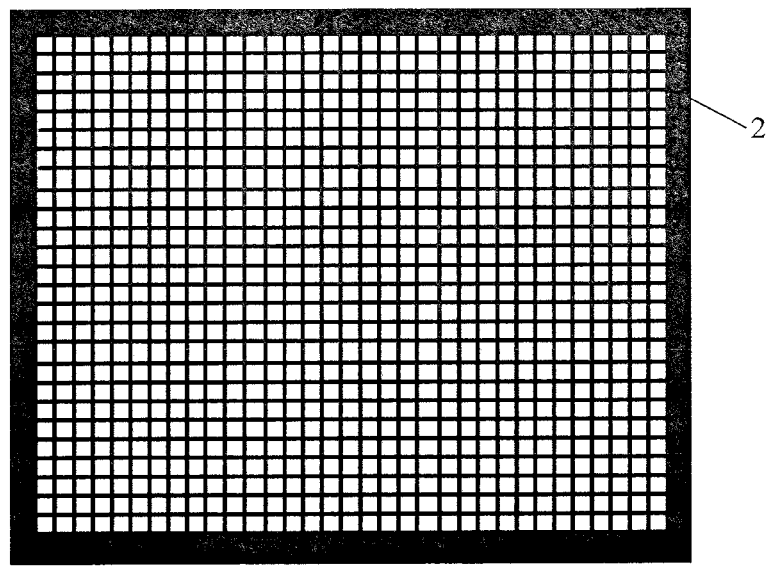
FIG. 6 is a view showing a detection effect for the detection as shown in FIG. 5.

In a case where the sets of positive and negative electrodes of the light emitting diode substrate 1 are all in electric conduction, referring to FIGS. 4 and 5, an electric field will be formed between each positive electrode and a negative electrode adjacent to the each positive electrode, of the light emitting diode substrate 1 to be detected such that liquid crystal in a portion of the liquid crystal plate 2 corresponding to the electric field is deflected to ensure the portion A of the liquid crystal plate 2 corresponding to the electric field to transmit light, that is, to ensure the light emitted from the detecting light source 3 to pass through the portion A of the liquid crystal plate 2 to impinge the light emitting diode substrate 1 directly and be reflected by the light emitting diode substrate 1 to eyes of a person performing the detection, that is, to ensure a portion, between the positive electrode and the negative electrode adjacent to the positive electrode, of the light emitting diode substrate 1 to be seen. FIG. 6 shows a detection result.

Figure 7:
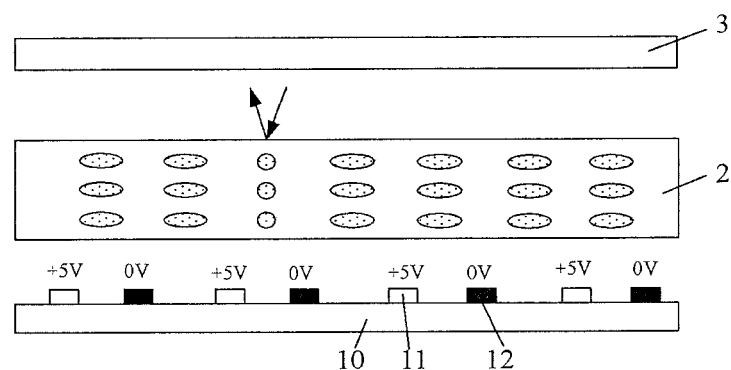
FIG. 7 is a schematic view for detection of the line detecting tool, as shown in FIG. 2, on the light emitting diode substrate in case where a set of positive electrode and negative electrode thereof is not in electric conduction.
Figure 8:
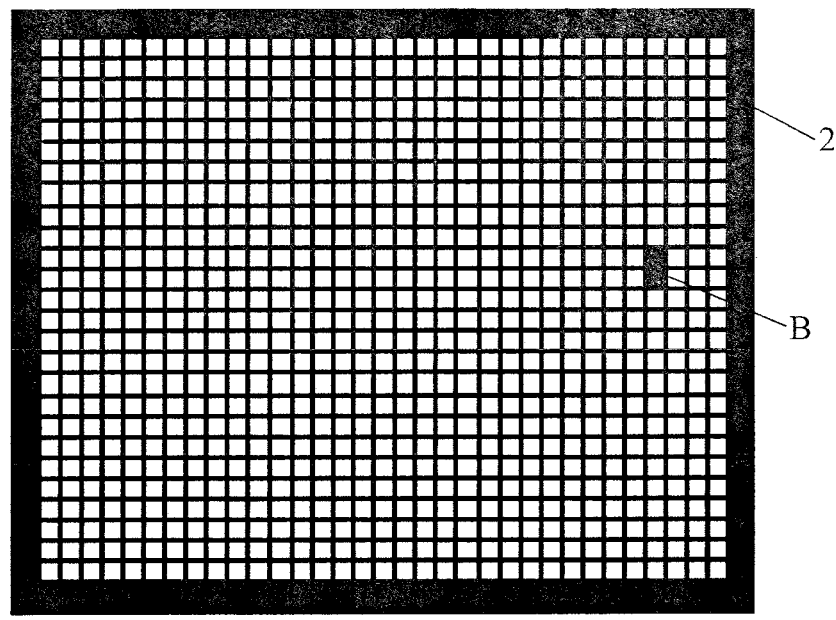
FIG. 8 is a view showing a detection effect for the detection as shown in FIG. 7.

In a case where one or more of the sets of positive and negative electrodes of the light emitting diode substrate 1 to be detected are not in electric conduction, referring to FIGS. 7 and 8, an electric field is formed between each positive electrode and a negative electrode adjacent to the each positive electrode, which are in electric conduction, of the light emitting diode substrate 1 to be detected, and no electric field is formed between each positive electrode and a negative electrode adjacent to the each positive electrode, which are not in electric conduction, of the light emitting diode substrate 1. In this case, a portion, which corresponds to the electric field, of the liquid crystal plate 2 is of light transmission while a portion, which is subject to no electric field, of the liquid crystal plate 2 is in light shielding state, that is, the liquid crystal plate 2 has an area where light is not transmitted and a black point or a black block is displaced such that a portion, which is shielded by the non-transmissive portion of the liquid crystal plate 2, of the light emitting diode substrate 1 to be detected cannot be seen by a person performing the detection. FIG. 8 shows a detection result.

In another embodiment, the liquid crystal plate 2 is a structure which is of light transmission in a turn-off state and the detection may be reverse to the above mentioned detection of the liquid crystal plate 2 which is of light transmission in a turn-on state and will not be repeatedly described herein.

As above, according to the embodiments of the present disclosure, the detecting light source 3 and the liquid crystal plate 2 are combined together, that is, they are combined to form a line detecting tool for a light emitting diode substrate, to accurately detect whether the sets of positive and negative electrodes of the light emitting diode substrate are all in electric conduction or not, according to whether one or more portions of the liquid crystal plate 2 are in a light transmission state or not, after contacting the liquid crystal plate 2 with the sets of positive and negative electrodes of the light emitting diode substrate 1 to be detected, energizing the sets of positive and negative electrodes and illuminating the liquid crystal plate 2 by the detecting light source 3. The line detecting tool according to the embodiments of the present disclosure may be produced in low cost and may perform a detection on a circuit line of a light emitting diode substrate in a simple and convenient way without being limited by a spacing size between two adjacent positive and negative electrodes on the light emitting diode substrate 1 to be detected, that is, the circuit line of the light emitting diode substrate 1 to be detected may be detected by using the liquid crystal plate 2 upon covering the liquid crystal plate 2 on the light emitting diode substrate 1, no matter how the spacing size between the two adjacent positive and negative electrodes of the light emitting diode substrate 1 to be detected is configured, thereby obtaining a high universality.

Further, compared with detection on each set of positive electrode and negative electrode of a light emitting diode substrate to be detected one by one by a probe in related art, the line detecting tool according to the embodiments of the present disclosure may simultaneously detect electric conduction of the entire sets of positive and negative electrodes of the light emitting diode substrate 1 to be detected by directly covering the liquid crystal plate 2 on the light emitting diode substrate 1 to make the liquid crystal plate 2 contact the sets of positive and negative electrodes of the light emitting diode substrate 1, and thus largely increases detection efficiency and is in favor of detection on the circuit line of the light emitting diode substrate 1 in batches.

It is noted that the above mentioned structure of the liquid crystal plate 2 may be set as required in such way that deflection of the liquid crystal of a portion, which corresponds to the positive electrode and negative electrode that are in electric conduction, of the liquid crystal plate 2 can be achieved under the electric field between the positive electrode and negative electrode, after the liquid crystal plate 2 contacts the sets of positive and negative electrodes of the light emitting diode substrate 1 to be detected.

Figure 3:
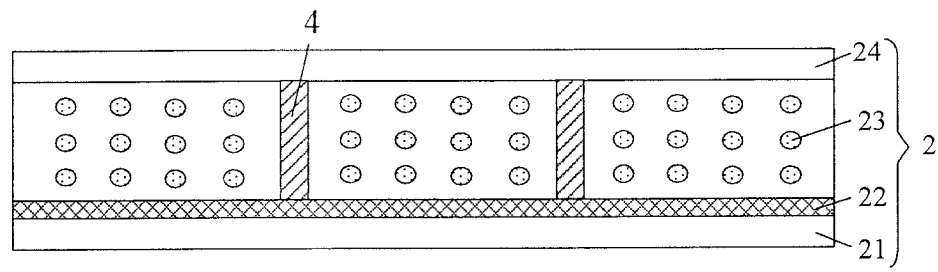
FIG. 3 is a structural schematic view of a liquid crystal plate provided by embodiments of the present disclosure.

Exemplarily, referring to FIG. 3, in the embodiment, the liquid crystal plate 2 includes a first substrate 21 and a second substrate 24, configured to be opposite to each other, and a liquid crystal 23 between the first substrate 21 and the second substrate 24. In the embodiment, an alignment film is provided on a surface of the first substrate 21 facing the liquid crystal 23 and/or a surface of the second substrate 24 facing the liquid crystal 23; a surface, away from the liquid crystal 23, of either, which is provided with the alignment film, of the first substrate 21 and the second substrate 24 is configured to contact the sets of positive and negative electrodes of the light emitting diode substrate 1 to be detected. In other words, the liquid crystal plate 2 according to the embodiments of the present disclosure may have the alignment film on either of the first substrate 21 and the second substrate 24, such as in FIG. 3, the alignment film 22 is provided on the surface of the first substrate 21 facing the liquid crystal 23. In another embodiment, alignment films may be provided in both the first substrate 21 and the second substrate 24. It is noted that, no matter what configuration the liquid crystal plate 2 were, the one of the first substrate 21 and the second substrate 24 of the liquid crystal plate 2 that is provided with the alignment film shall be brought into contact with the sets of positive and negative electrodes of the light emitting diode substrate 1 to be detected when the liquid crystal plate 2 covers the light emitting diode substrate 1. With this configuration, after energizing the sets of positive and negative electrodes of the light emitting diode substrate 1 to be detected, an electric field is generated between a set of a positive electrode and a negative electrode adjacent to the positive electrode if they are in electric conduction, such that liquid crystal of a portion, which corresponds to the electric field, of the liquid crystal plate 2 is deflected and thus the portion is of light transmission.

It is understood that the first substrate 21 and the second substrate 24 of the liquid crystal plate 2 are commonly formed from a same transparent material. For example, the first substrate 21 and the second substrate 24 are both transparent glass substrates, or are both transparent resin substrates, such that they have the same structure and properties. In an embodiment, in order to facilitate detection of the light emitting diode substrate 1 to be detected by the liquid crystal plate 2, the first substrate 21 and the second substrate 24 are each provided with an alignment film such that the surface of each of the first substrate 21 and the second substrate 24 away from the liquid crystal 23 may be used to contact the sets of positive and negative electrodes of the light emitting diode substrate 1 without identifying which substrate of the liquid crystal plate 2 is provided with the alignment film, thereby obtaining convenient usage and further increasing detection efficiency of the line detecting tool.

In addition, in order to ensure a stable deflection of the liquid crystal 23 of the liquid crystal plate 2 under action of the above mentioned electric field, a thickness of the first substrate 21 or the second substrate 24 of the liquid crystal plate 2 that is used to contact the light emitting diode substrate 1 to be detected is as small as possible as long as a mechanical strength of the liquid crystal plate 2 is enough. In an embodiment, a thickness of one of the first substrate 21 and the second substrate 24 of the liquid crystal plate 2 that is used to contact the sets of positive electrodes and negative electrodes of the light emitting diode substrate 1 to be detected is less than or equal to 0.1 mm.

According to embodiments of the present embodiments, when the liquid crystal 23 of the liquid crystal plate 2 includes a colorless liquid crystal, in order to facilitate a person observing the detection effect of the line detecting tool, the base substrate 10 of the light emitting diode substrate 1 to be detected may be made of material with its own color, or may be coated with a color coating on a surface on which sets of positive and negative electrodes are configured so as to increase identification of a portion of the light emitting diode substrate 1 to be detected under the liquid crystal plate 2.

According to the embodiments of the present disclosure, the liquid crystal 23 of the liquid crystal plate 2 may include a color liquid crystal, such as a red liquid crystal, a yellow liquid crystal, and et al. With this configuration, the detection result of the liquid crystal plate 2 may be efficiently identified depending on color change of the color liquid crystal under action of the electric field, thereby achieving more accurate detection of the electric connection/conduction of the circuit line of the light emitting diode substrate 1 to be detected.

In an embodiment, the liquid crystal plate 2 for the line detecting tool has a large size. In order to avoid the first substrate 21 or the second substrate 24 from becoming less flat and prevent a spacing between the first substrate 21 and the second substrate 24 from changing by an inward recess of the first substrate 21 or the second substrate 24 in central region of the liquid crystal plate 2 due to its own gravitation force, at least a spacer 4 is provided between the first substrate 21 and the second substrate 24 so as to support the first substrate 21 and the second substrate 24 by the spacer 4, thereby ensuring the spacing between the first substrate 21 and the second substrate 24 in the whole liquid crystal to be maintained at a uniform value so that the liquid crystal 23 of the liquid crystal plate 2 has a uniform thickness, and maintaining the liquid crystal plate 2 to be flat and thus improving detection effect of the circuit line of the light emitting diode substrate 1 by the liquid crystal plate 2.

In addition, in an embodiment where a plurality of spacers 4 are provided, the spacers 4 are commonly distributed evenly in directions parallel to a plane where the liquid crystal plate 2 is located, between the first substrate 21 and the second substrate 24. The spacers 4 are commonly fixed on a surface of the first substrate 21 or the second substrate 24 that faces the liquid crystal 23. In an embodiment where the surface of the first substrate 21 or the second substrate 24 that faces the liquid crystal 23 is provided with the alignment film, the spacer 4 may be disposed on the surface, which faces liquid crystal 23, of the alignment film of the one of the first substrate 21 and the second substrate 24.

Figure 9:
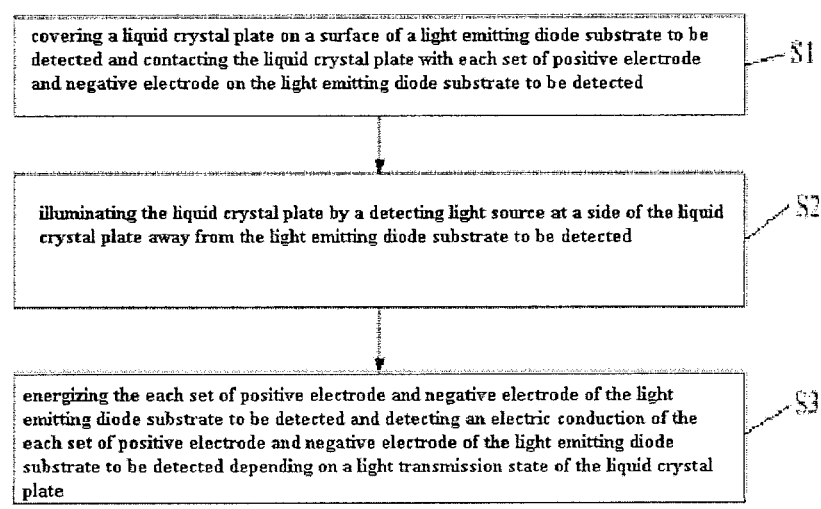
FIG. 9 is a schematic flow chart of a line detecting method according to embodiments of the present disclosure.

Embodiments of the present disclosure further provide a line detecting method for a light emitting diode substrate, implemented by the line detecting tool provided by the above mentioned embodiments of the present disclosure. Referring to FIG. 9, the line detecting method includes:

a step S1: covering a liquid crystal plate on a surface of a light emitting diode substrate to be detected and contacting the liquid crystal plate with each set of positive electrode and negative electrode on the light emitting diode substrate to be detected.

Each set of positive electrode and negative electrode includes a positive electrode and a negative electrode and is provided to connect to a light emitting diode. The positive electrode and the negative electrode of each set of positive electrode and negative electrode are exposed on the surface of the light emitting diode substrate to be detected such that the liquid crystal plate can contact each set of positive electrode and negative electrode of the light emitting diode substrate when the liquid crystal plate is brought to cover on the surface of the light emitting diode substrate.

The above mentioned liquid crystal plate is commonly an in-plane switching (IPS) liquid crystal plate. The liquid crystal plate includes a first substrate and a second substrate, configured to be opposite to each other, and a liquid crystal between the first substrate and the second substrate; wherein an alignment film is provided on a surface of the first substrate facing the liquid crystal and/or a surface of the second substrate facing the liquid crystal. The above mentioned contacting liquid crystal plate with each set of positive electrode and negative electrode of the light emitting diode substrate includes: contacting a surface, away from the liquid crystal, of either one, which is provided with the alignment film, of the first substrate and the second substrate with the each set of positive electrode and negative electrode of the light emitting diode substrate to be detected.

The line detecting method further includes a step S2: illuminating the liquid crystal plate by a detecting light source at a side of the liquid crystal plate away from the light emitting diode substrate to be detected.

The detecting light source is used as a provider of light signal and may be a lighting element or luminaire, such as a light emitting diode lamp bar or a light emitting diode strip light.

The line detecting method further includes a step S3: energizing the each set of positive electrode and negative electrode of the light emitting diode substrate to be detected and detecting an electric conduction of the each set of positive electrode and negative electrode of the light emitting diode substrate to be detected depending on a light transmission state of the liquid crystal plate.

The light emitting diode substrate to be detected is commonly provided with a positive electrode bonding area that is in connection with the positive electrode of the each set of positive electrode and negative electrode and a negative electrode bonding area that is in connection with the negative electrode of the each set of positive electrode and negative electrode. A wiring between each set of positive electrode and negative electrode and the positive electrode bonding area and the negative electrode bonding area may be designed as required, and structure of the wiring is fixed after the light emitting diode substrate is formed. The positive electrode bonding area and the negative electrode bonding area of the light emitting diode substrate to be detected are respectively connected to voltage terminals, thereby achieving the energizing of each set of positive electrode and negative electrode of the light emitting diode substrate.

It is understood that the liquid crystal plate may be implemented in a structure that is of light transmission in a turn-on state, that is, the liquid crystal plate transforms from the light shielding state to the light transmission state under action of an electric field; of course, the liquid crystal plate may be implemented in a structure that is of light transmission in a turn-off state, that is, the liquid crystal plate transforms from the light transmission state to the light shielding state under action of an electric field.

If the liquid crystal plate is of light transmission in a turn-on state, in the above mentioned step S3, the detecting an electric conduction of the each set of positive electrode and negative electrode of the light emitting diode substrate to be detected depending on a light transmission state of the liquid crystal plate includes: detecting the light transmission state of the liquid crystal plate; if a portion of the liquid crystal plate corresponding to a set of positive electrode and negative electrode is of light transmission, the set of positive electrode and negative electrode corresponding to the portion that is of light transmission is in electric conduction; if a portion of the liquid crystal plate corresponding to a set of positive electrode and negative electrode is not of light transmission, the set of positive electrode and negative electrode corresponding to the portion that is not of light transmission is not in electric conduction. Herein, the portion of the liquid crystal plate corresponding to a set of positive electrode and negative electrode means the portion of the liquid crystal plate that overlaps an orthographic projection of the set of positive electrode and negative electrode on the liquid crystal plate.

If the liquid crystal plate is of light transmission in a turn-off state, in the above step S3, the detecting an electric conduction of the each set of positive electrode and negative electrode of the light emitting diode substrate to be detected depending on a light transmission state of the liquid crystal plate includes: detecting the light transmission state of the liquid crystal plate; if a portion of the liquid crystal plate corresponding to a set of positive electrode and negative electrode is of light transmission, the set of positive electrode and negative electrode corresponding to the portion that is of light transmission is not in electric conduction; if a portion of the liquid crystal plate corresponding to a set of positive electrode and negative electrode is not of light transmission, the set of positive electrode and negative electrode corresponding to the portion that is not of light transmission is in electric conduction.

The line detecting method for a light emitting diode substrate provided by the embodiments of the present disclosure can achieve the same advantages as the line detecting tool for a light emitting diode substrate according to the embodiments of the present disclosure. According to the embodiments, electric connection of a circuit line of a light emitting diode substrate to be detected can be simply and rapidly detected by observing a light transmission state of the liquid crystal plate; and the line detecting method may be implemented to effectively increase detection efficiency in a convenient manner and has a high universality.

It is noted that, in order to ensure a thickness of the liquid crystal plate to be uniform, at least a spacer is provided between the first substrate and the second substrate of the liquid crystal plate. In the above step S1, when the liquid crystal plate covers the surface of the light emitting diode substrate to be detected, each of the spacers of the liquid crystal plate is configured to stagger to any one of the sets of positive electrodes and negative electrodes of the light emitting diode substrate to be detected, or in other words, an orthographic projection of each of the spacers of the liquid crystal plate on the light emitting diode substrate to be detected does not overlap any one of the sets of positive electrodes and negative electrodes of the light emitting diode substrate to be detected, so as to avoid adverse influence on the detection on the circuit line of the light emitting diode substrate from the spacers.

The above is only the specific embodiments of the present disclosure, but the scope of the present disclosure is not limited thereto. Any person skilled in the art can easily think of changes or substitutions within the technical scope of the disclosure, which should be covered within the scope of protection of the present disclosure. Therefore, the scope of protection of the present disclosure should be defined by the scope of protection of the claims.

The invention claimed is:

1. A line detecting tool for a light emitting diode substrate comprising a detecting light source and a liquid crystal plate, wherein,
    the liquid crystal plate is configured to be arranged between the detecting light source and a light emitting diode substrate to be detected and to be in contact with each set of positive electrode and negative electrode of the light emitting diode substrate, so as to transform from a light transmission state to a light shielding state or from the light shielding state to the light transmission state after energizing the each set of positive electrode and negative electrode of the light emitting diode substrate to be detected;
    the detecting light source is configured to illuminate the liquid crystal plate.

2. The line detecting tool as claimed in claim 1, wherein the liquid crystal plate comprises a first substrate and a second substrate, configured to be opposite to each other, and a liquid crystal between the first substrate and the second substrate; and
    the liquid crystal plate further comprises an alignment film on a surface of the first substrate facing the liquid crystal and/or on a surface of the second substrate facing the liquid crystal;
    a surface, away from the liquid crystal, of either, which is provided with the alignment film, of the first substrate and the second substrate is configured to contact the each set of positive electrode and negative electrode of the light emitting diode substrate to be detected.

3. The line detecting tool as claimed in claim 2, wherein a thickness of one, which is configured to contact the each set of positive electrode and negative electrode of the light emitting diode substrate to be detected, of the first substrate and the second substrate of the liquid crystal plate is less than or equal to 0.1 mm.

4. The line detecting tool as claimed in claim 2, wherein at least one spacer is provided between the first substrate and the second substrate to support the first substrate and the second substrate.

5. The line detecting tool as claimed in claim 2, wherein the liquid crystal comprises a color liquid crystal.

6. The line detecting tool as claimed in claim 2, wherein the first substrate and the second substrate each comprise a transparent glass substrate or a transparent resin substrate.

7. A line detecting method for a light emitting diode substrate, the line detecting method comprising:
    covering a liquid crystal plate on a surface of a light emitting diode substrate to be detected and contacting the liquid crystal plate with each set of positive electrode and negative electrode of the light emitting diode substrate to be detected;
    illuminating the liquid crystal plate by a detecting light source at a side of the liquid crystal plate away from the light emitting diode substrate to be detected; and
    energizing the each set of positive electrode and negative electrode of the light emitting diode substrate to be detected and detecting an electric conduction of the each set of positive electrode and negative electrode of the light emitting diode substrate to be detected depending on a light transmission state of the liquid crystal plate.

8. The line detecting method as claimed in claim 7, wherein,
    the liquid crystal plate is of light transmission in a turn-on state; the detecting an electric conduction of the each set of positive electrode and negative electrode of the light emitting diode substrate to be detected depending on a light transmission state of the liquid crystal plate comprises: detecting the light transmission state of the liquid crystal plate; if a portion of the liquid crystal plate corresponding to a set of positive electrode and negative electrode is of light transmission, the set of positive electrode and negative electrode corresponding to the portion that is of light transmission is in electric conduction; if a portion of the liquid crystal plate corresponding to a set of positive electrode and negative electrode is not of light transmission, the set of positive electrode and negative electrode corresponding to the portion that is not of light transmission is not in electric conduction; or the liquid crystal plate is of light transmission in a turn-off state; the detecting an electric conduction of the each set of positive electrode and negative electrode of the light emitting diode substrate to be detected depending on a light transmission state of the liquid crystal plate comprises: detecting the light transmission state of the liquid crystal plate; if a portion of the liquid crystal plate corresponding to a set of positive electrode and negative electrode is of light transmission, the set of positive electrode and negative electrode corresponding to the portion that is of light transmission is not in electric conduction; if a portion of the liquid crystal plate corresponding to a set of positive electrode and negative electrode is not of light transmission, the set of positive electrode and negative electrode corresponding to the portion that is not of light transmission is in electric conduction.

9. The line detecting method as claimed in claim 8, wherein the liquid crystal plate comprises a first substrate and a second substrate, configured to be opposite to each other, and a liquid crystal between the first substrate and the second substrate; and the liquid crystal plate further comprises an alignment film on a surface of the first substrate facing the liquid crystal and/or a surface of the second substrate facing the liquid crystal;

the contacting the liquid crystal plate with each set of positive electrode and negative electrode of the light emitting diode substrate to be detected comprises: contacting a surface, away from the liquid crystal, of either one, which is provided with the alignment film, of the first substrate and the second substrate with the each set of positive electrode and negative electrode of the light emitting diode substrate to be detected.

10. The line detecting method as claimed in claim 9, wherein, at least one spacer is provided between the first substrate and the second substrate;

when the liquid crystal plate covers the surface of the light emitting diode substrate to be detected, an orthographic projection of the at least one spacer of the liquid crystal plate on the light emitting diode substrate to be detected never overlaps any one of the sets of positive electrodes and negative electrodes of the light emitting diode substrate to be detected.

11. The line detecting method as claimed in claim 7, wherein, the liquid crystal plate comprises a first substrate and a second substrate, configured to be opposite to each other, and a liquid crystal between the first substrate and the second substrate; and the liquid crystal plate further comprises an alignment film on a surface of the first substrate facing the liquid crystal and/or a surface of the second substrate facing the liquid crystal;

the contacting the liquid crystal plate with each set of positive electrode and negative electrode of the light emitting diode substrate to be detected comprises: contacting a surface, away from the liquid crystal, of either one, which is provided with the alignment film, of the first substrate and the second substrate with the each set of positive electrode and negative electrode of the light emitting diode substrate to be detected.

12. The line detecting method as claimed in claim 11, wherein at least one spacer is provided between the first substrate and the second substrate;

when the liquid crystal plate covers the surface of the light emitting diode substrate to be detected, an orthographic projection of the at least one spacer of the liquid crystal plate on the light emitting diode substrate to be detected never overlaps any one of the sets of positive electrodes and negative electrodes of the light emitting diode substrate to be detected.

* * * * *